United States Patent
Dai et al.

(10) Patent No.: US 6,859,073 B1
(45) Date of Patent: Feb. 22, 2005

(54) FAST VCO CALIBRATION FOR FREQUENCY SYNTHESIZERS

(75) Inventors: Liang Dai, Carlsbad, CA (US); Jie Huang, San Diego, CA (US); Kevin Hsi-Huai Wang, San Diego, CA (US); Hung-Chuan Pai, San Diego, CA (US)

(73) Assignee: Prominent Communications, Inc., San Diego, CA (US)

( * ) Notice: Subject to any disclaimer, the term of this patent is extended or adjusted under 35 U.S.C. 154(b) by 0 days.

(21) Appl. No.: 10/687,492

(22) Filed: Oct. 17, 2003

(51) Int. Cl.[7] .............................................. H03B 21/00
(52) U.S. Cl. ........................................ 327/105; 331/179
(58) Field of Search .............................. 327/105, 147, 327/156, 162; 331/17, 177, 179; 375/376

(56) References Cited

U.S. PATENT DOCUMENTS 6,483,390 B2 * 11/2002 Welland ................... 331/36 C
6,597,249 B2 * 7/2003 Chien et al. ............. 331/177 R
6,741,846 B1 * 5/2004 Welland et al. ............. 455/260

* cited by examiner

*Primary Examiner*—Linh My Nguyen
(74) *Attorney, Agent, or Firm*—H.C. Lin Patent Agent

(57) ABSTRACT

The voltage-oscillator (VCO) in a frequency synthesizer using a phase-locked loop (PLL) is calibrated during power up or channel switching. The VCO has a coarse frequency control and a fine frequency control. The coarse control consists of digital bits that are used for calibration. The coarse control is connected to the charge pump output as in a regular PLL. By searching for the optimal control setting, the center frequency of the VCO is trimmed close to the desired frequency for the PLL to lock. This allows small VCO gain without losing the tolerance of process and temperature variations. As a result, the PLL phase noise performance is improved.

6 Claims, 7 Drawing Sheets

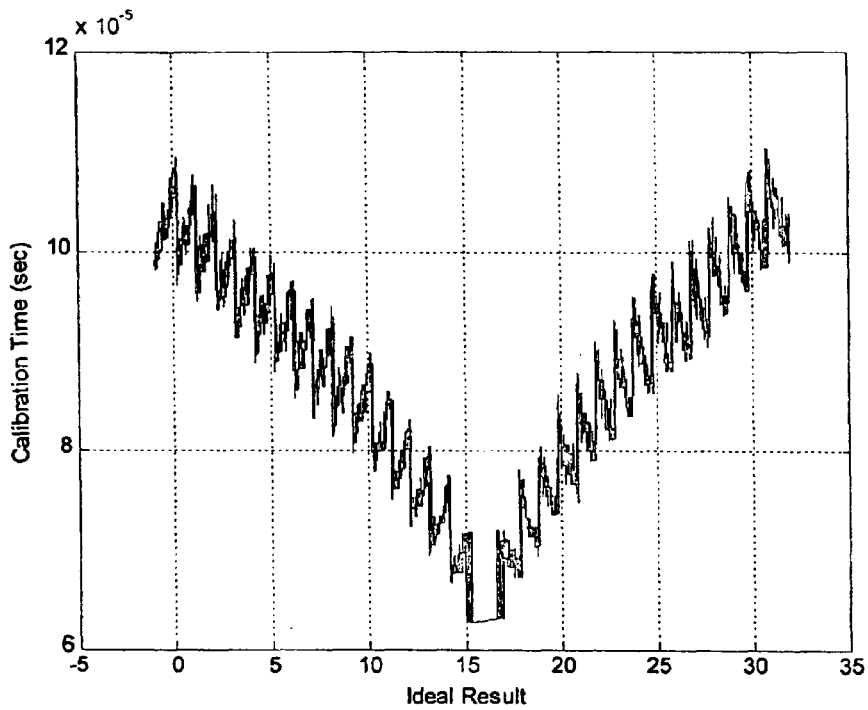

Figure 10.

| Pin | I/O | Description |
|---|---|---|
| fsStart | I | Rising edge triggers the start of the calibration. |
| vcoDiv | I | VCO feedback divider output, frequency close to 1MHz, depending on vcoStep[4:0]. |
| CLK | I | 44MHz clock from crystal oscillator |
| vcoStep[4:0] | O | VCO frequency control, "00000": lowest frequency, "11111": highest freqnecy; default: "10000" |
| Rdy2Cal | O | '1': VCO calibrated; '0': VCO not calibrated; default: '1' |
| vcoErr | O | '1': VCO calibrated with error; '0': VCO calibrated without error; default: '0' |
| EN | O | '1': enables CNT, puts PLL into calibration; '0': disables CNT, puts PLL into normal operation; default: '0' |
| U/D[1:0] | N/A | +1: increment vcoStep; -1: decrement vcoStep; 0: remain unchanged; -2: waiting, remain unchanged |

Table 1.

FAST VCO CALIBRATION FOR FREQUENCY SYNTHESIZERS

BACKGROUND OF THE INVENTION

1. Field of the Invention

This invention relates to frequency synthesizers, particularly to the voltage-controlled oscillator (VCO) of a frequency synthesizers for radio transceivers.

2. Brief Description of Related Art

In wireless communications system, frequency synthesizers are used to generate stable local oscillator (LO) frequencies with very high accuracy. A frequency synthesizer is usually a phase-locked loop (PLL) whose simplified diagram is shown in FIG. 1. It consists of a reference frequency divider (1/M), a feedback frequency divider (1/N), a phase comparator (PC), a charge pump (CP), a loop filter (LPF) and a VCO. Under phase-locked condition, the frequencies of the two signals at the PC inputs are identical. This forces the VCO frequency (Fout) to be NIM of the input reference frequency (Fref).

Usually the center frequency of a free-running VCO exhibits large variations over process and temperature. In order to generate the desired LO frequency, the frequency tuning range of the VCO needs to be large enough to overcome the above variations. Unfortunately, this leads to a large VCO gain (Kvco), which results in poor phase noise of the PLL.

To increase the tuning range of the VCO without sacrificing the phase noise performance, Welland proposed in U.S. Pat. No. 6,137,372 to use a coarse tuning arrangement in conjunction with fine tuning for the VCO. The VCO is designed in such a way that its frequency can be controlled both discretely through some digital bits and continuously through an analog voltage. The digital control varies the VCO frequency over a large range with coarse steps; while the analog control tunes the VCO frequency over a much narrower range.

Chien proposed in U.S. Pat. No. 6,597,249 a binary search algorithm to find the optimal digital control word. The binary search algorithm greatly reduces the search time compared to a linear search algorithm.

SUMMARY OF THE INVENTION

An object of this invention is to minimize the VCO gain without scarifying the tolerance of process and temperature variation of the VCO. Another object of the invention is to improve the phase noise performance of the PLL. Still another of this invention is to shorten the settling time of a frequency synthesizer. These objects are achieved by first calibrating the VCO to within a small tolerance of the desired VCO control voltage. The VCO frequency is incremented or decremented according the to frequency measurement result. When the VCO frequency error is large during calibration, the control word is changed in discrete steps to bring the frequency of the VCO to within a preset tolerance. When the VCO frequency is close to the desired frequency, the PLL is switched to a conventional analog operating mode to accurately lock the VCO frequency with the reference frequency. This results in a shorter search time than prior art, and allows calibration during channel switching. This not only achieves more accurate results than prior art, but also potentially supports frequency hopping in the RF wireless communications. It also eliminates the need for a look-up table to store the calibration results for all the RF channels, which results in a more efficient hardware implementation

BRIEF DESCRIPTION OF THE DRAWINGS

FIG. 10 shows the required time for calibration.

Table 1 shows the pin description.

DETAILED DESCRIPTION OF THE INVENTION

The synthesizer of the present invention operates with two sequential modes; a calibration mode and an analog mode. During the calibration mode, the synthesizer locks the frequency of a VCO coarsely but rapidly to the reference frequency using a first phase-locked loop by generating an approximate control voltage for the VCO and to set the VCO frequency within a certain tolerance. This approximate control voltage is used to start operating a conventional phase-locked loop in the analog mode for fine tuning of the VCO.

Figure 1:
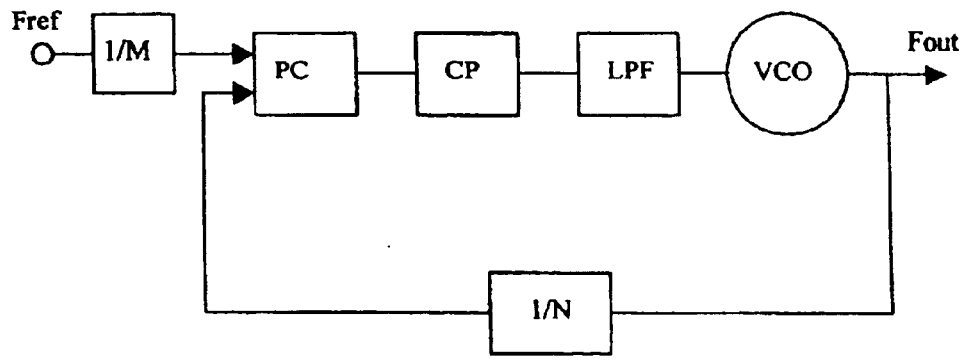
FIG. 1 shows a block diagram of a phase-locked loop (PLL)
Figure 2:
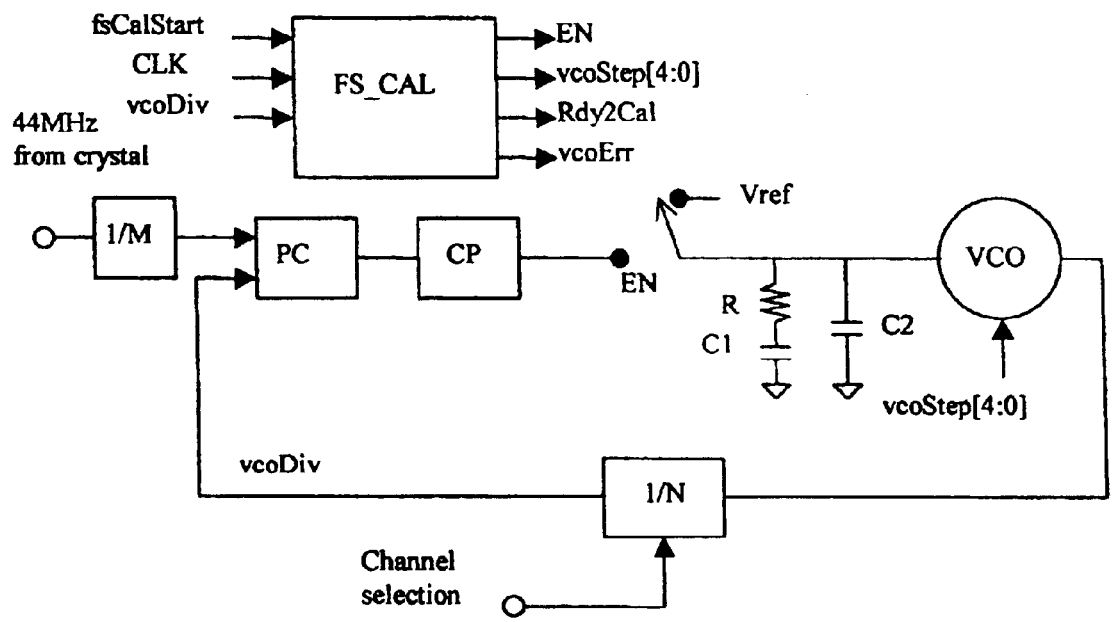
FIG. 2 shows a calibration circuit for a PLL based on the present invention.

The calibration circuit with the PLL is drawn in FIG. 2. The calibration PLL uses a FS_CAL block as a coarse phase detector instead of the conventional PC+CP phase detector shown in FIG. 1. The calibration is triggered by a rising edge of fsCalStart to FS_CAL. It first breaks the conventional PLL loop by raising EN signal to enable FS_CAL. Now the VCO control input is connected to a fixed reference voltage vcoStep[4.0] derived and held from the FS_CAL phase detector. The frequency of the free-running VCO is divided down to a frequency close to 1 MHz and fed back to the FS_CAL phase detector through vcoDiv lead, and its period is measured with a 44 MHz clock. After calibration is finished, EN is reset to 0, and the analog PLL loop including a phase comparator and a charge pump phase detector is closed or enabled.

Figure 3:
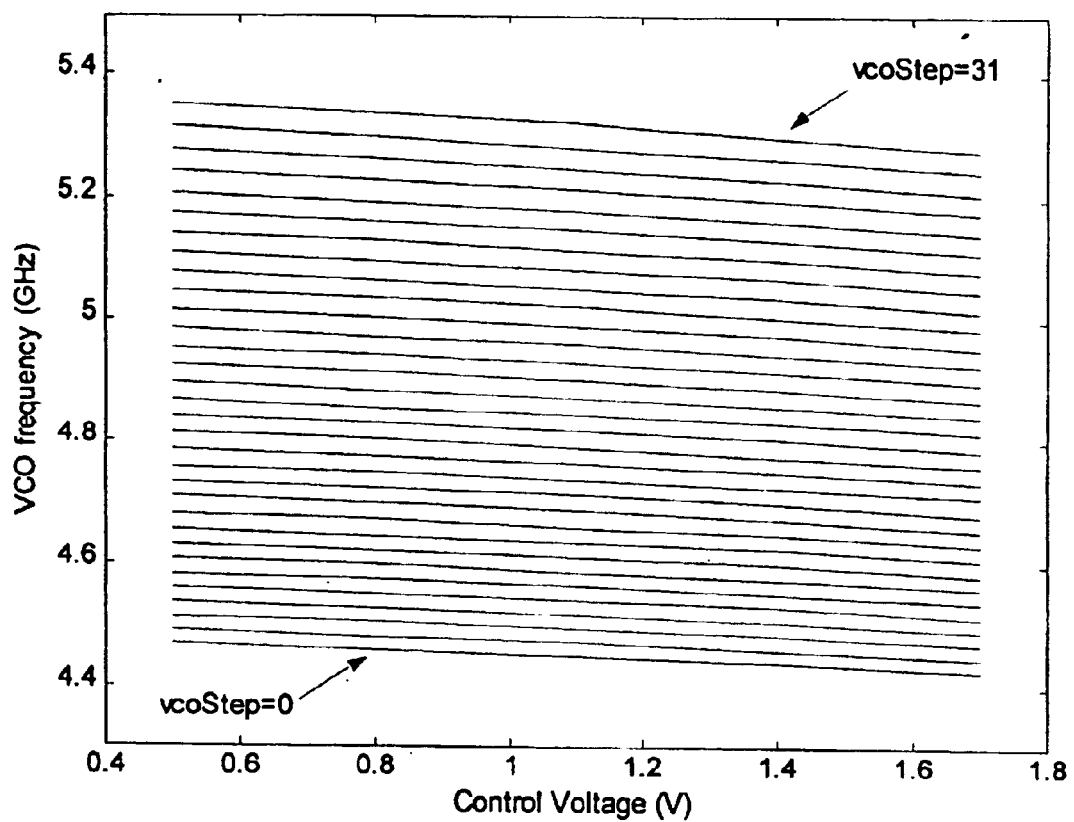
FIG. 3 shows the frequency of the VCO as function of different control voltage steps.
Figure 4:
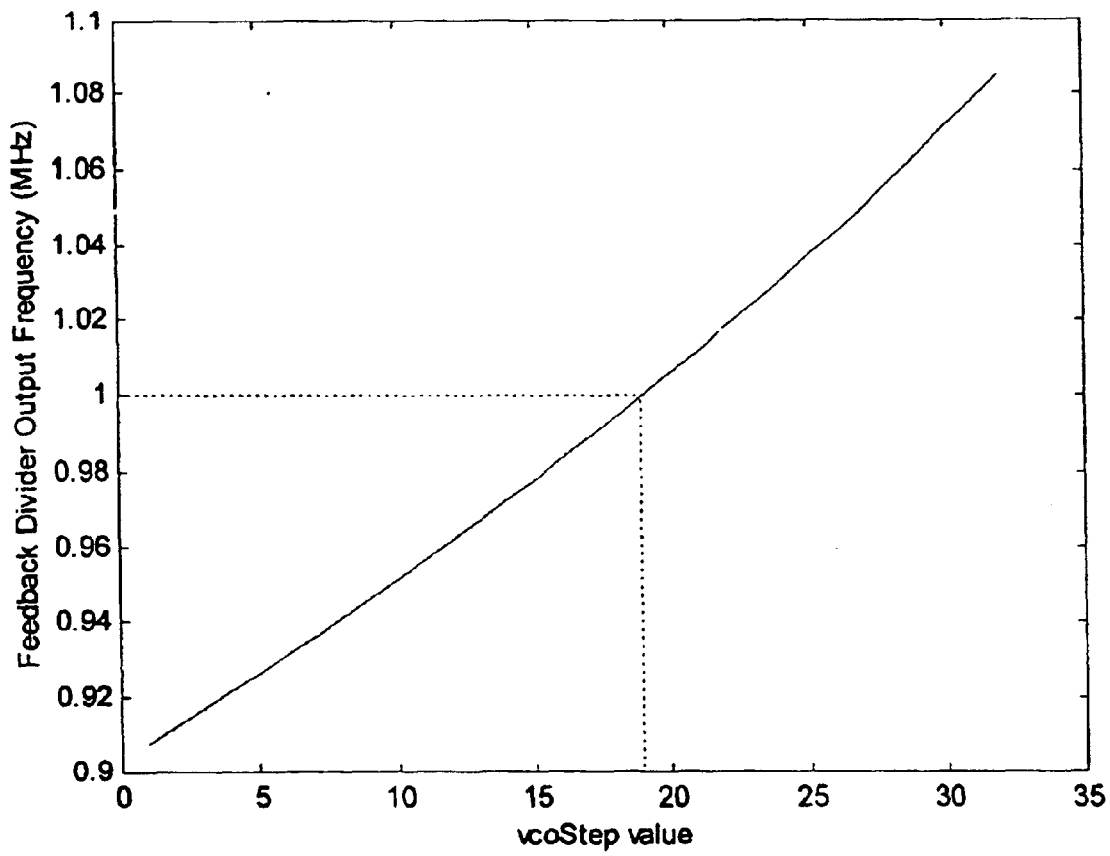
FIG. 4 shows the feedback divider output frequency vs control voltage steps.

The nominal VCO frequency at room temperature is shown in FIG. 3 as a function of its analog control voltage for each stepped value of vcoStep[4:0]. It varies over process and temperature. The VCO output frequency is divided by 2N and measured at the feedback divider in the PLL. FIG. 4 shows the feedback divider output frequency as a function of vcoStep value for a given control voltage of the VCO. The curve also varies over process and temperature. By setting the correct value of vcoStep[4:0], the divider output frequency is trimmed closest to 1 MHz, which is the target frequency for phase locking. For a fixed control voltage, the frequency resolution at the divider output is about 6.122 kHz for a single LSB step of vcoStep.

Figure 5:
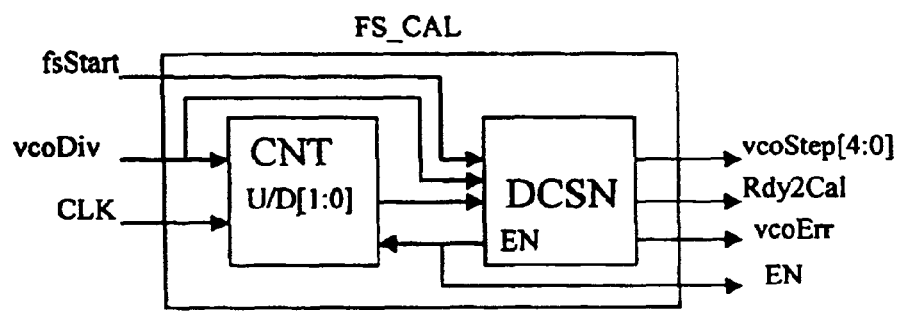
FIG. 5 shows a block diagram of the VCO calibration circuit.

A block diagram of the calibration circuit is shown in FIG. 5. It includes a 10-bit counter CNT and a decision making block DCSN. The I/O pins are described in Table 1. CNT counts the clock CLK, and indicates whether to increment or to decrement vcoStep of DCSN, which is a control unit that enables or disables CNT through EN, and calculates the VCO control value vcoStep[4:0]. EN signal also breaks or reconnects the PLL loop.

Figure 6:
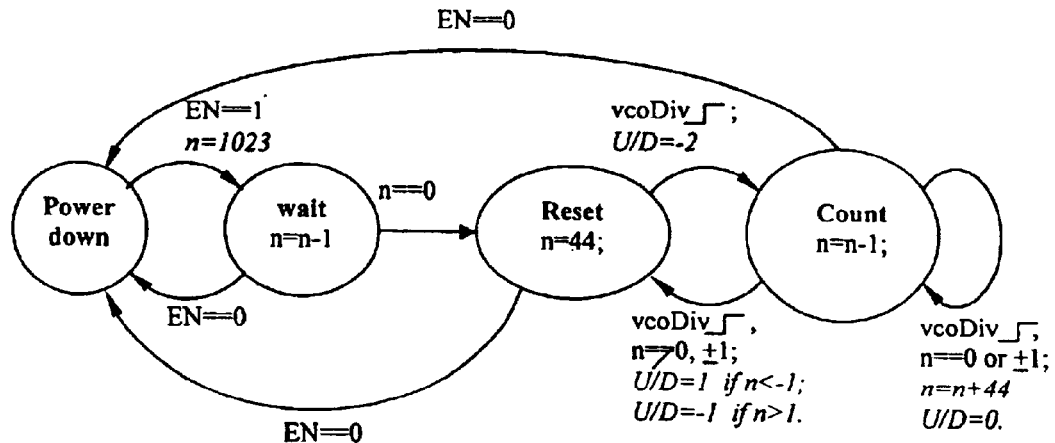
FIG. 6 shows the state transition diagram of the counter block in the calibration circuit.
Figure 7:
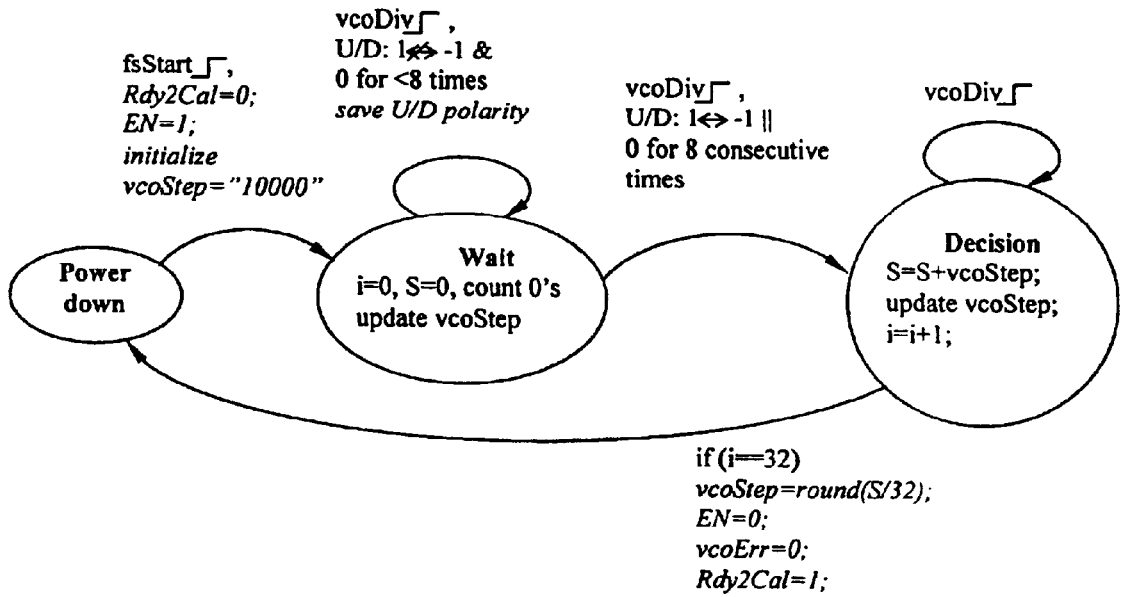
FIG. 7 shows the state transition diagram of the decision making block in the calibration block

The counter CNT and the decision making block DCSN are finite state machines whose state transition diagrams are shown in FIG. 6 and FIG. 7. At the end of the calibration, the calibration result should be held at vcoStep[4:0], and the signal. Rdy2Cal should be held high, indicating the finish of the calibration. The circuit should be able to start again at the next rising edge of the signal fsStart. vcoErr is set low if the calibration was successful. Otherwise, vcoErr is set high indicating an error is VCO calibration.

The counter CNT is powered up when EN is high. First it waits for about 23 us by counting 1023 clock cycles. This allows enough time for the VCO control to settle to the reference voltage Vref. Then it starts to count for every cycle of vcoDiv, which is the feedback divider output. If the period of vcoDiv is less then 43 clock cycles, it means that the VCO is too first. Therefore, it sets U/D to −1, indicating a decrement of vcoStep. If the period of vcoDiv is more than 45 clock cycles, it means that the VCO is too slow. Therefore, it sets U/ID to +1, indicating an increment of vcoStep. If the measurement is between 43 and 45, it implies that the VCO frequency is close to the target. It will set U/D to 0, indicating no change of vcoStep, and keep counting into the next vcoDiv cycle without resetting its value.

The decision making block DCSN is triggered by the rising edge of fsStart. Then it sets EN to high, which activates the counter CNT, breaks the PLL loop, and sets the VCO control voltage to Vref. It updates vcoStep based on the signal U/D. This pulls the VCO frequency close to the target frequency. When it sees vcoStep remain unchanged for 8 consecutive times or vcoStep start to head into a different direction, it enters averaging mode. It takes the average of 16 consecutive values of vcoStep, and take it as the final calibration result. During any of the above steps, if vcoStep overflows or underflows by trying to reach 32 or −1, vcoErr is raised high to indicate an error in the calibration process. However, the calibration continues normally with vcoStep clipped at 31 or 0.

Figure 8:
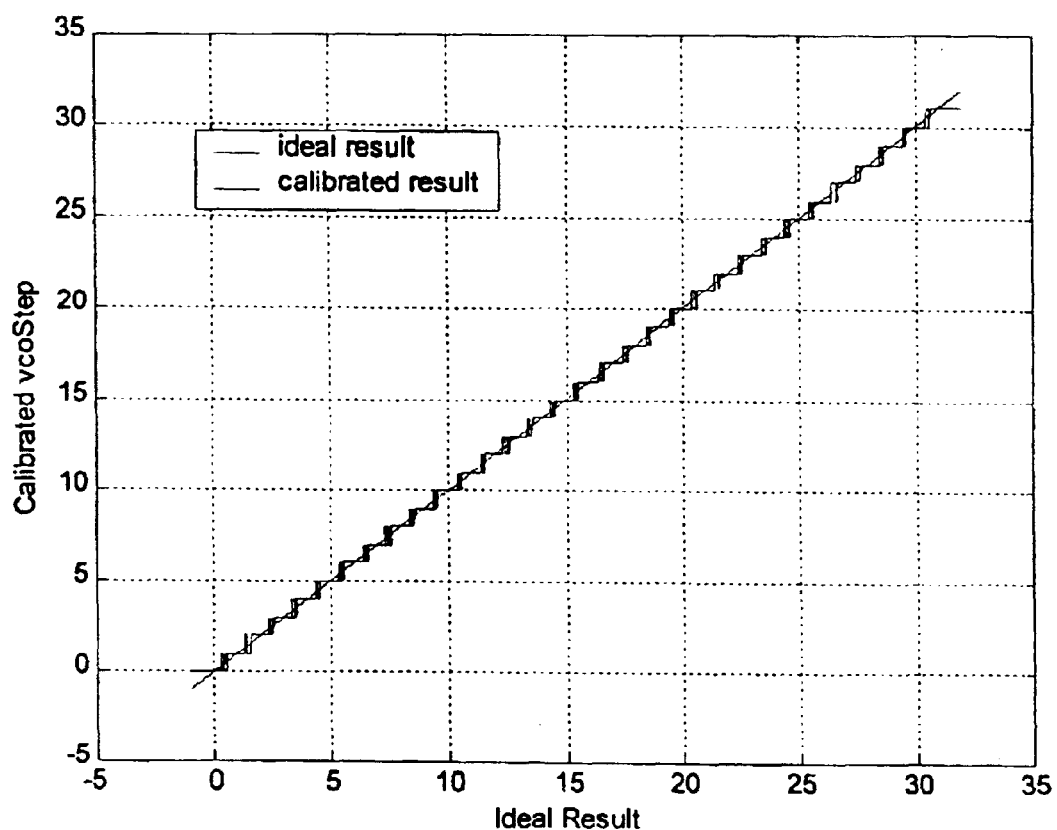
FIG. 8 shows the simulation result of the VCO control voltage steps.
Figure 9:
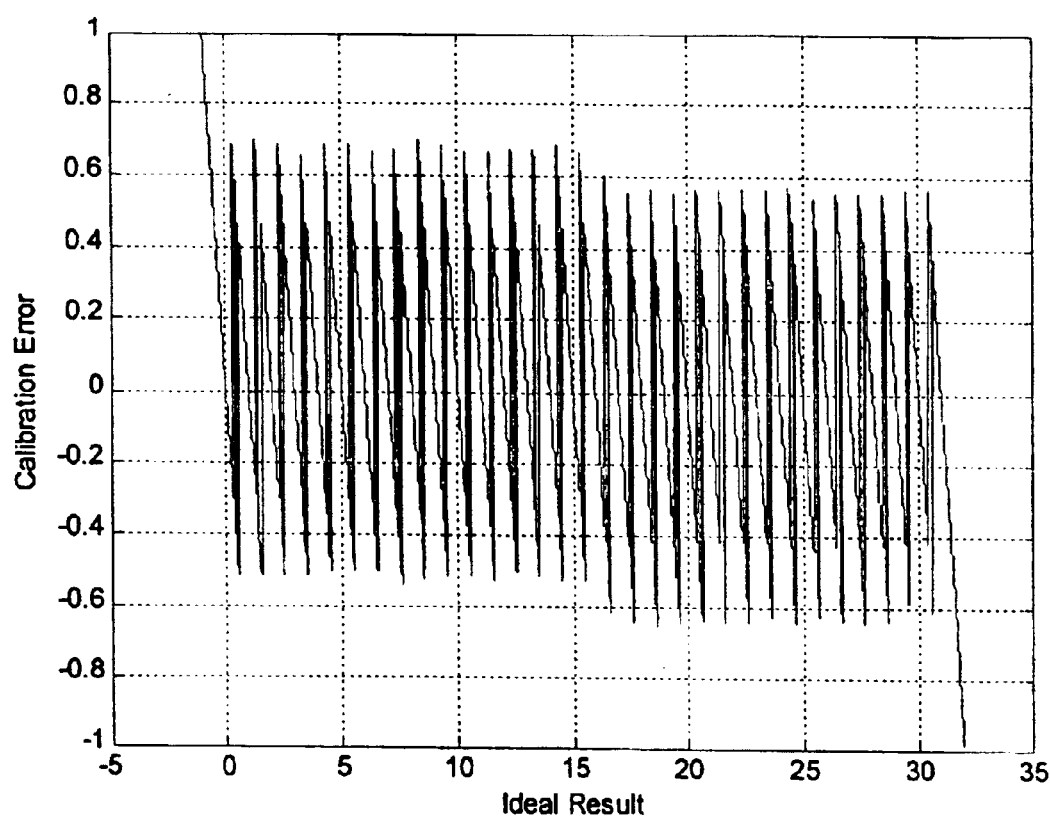
FIG. 9 shows the calibration errors of the VCO control voltage steps

The calibration algorithm described above has been implemented in a C++ program. The VCO center frequency is swept, and the calibrated vcoStep is shown in FIG. 8. VCO phase noise of 100 dBc/Hz at 1 MHz offset from 2.45 GHz is assumed. The calibrated vcoStep result is compared with the ideal result. FIG. 9 plots the calibration error, which is confined within ±0.7 LSB. FIG. 10 shows the required tine for the VCO calibration according to our simulation. The maximum time required is about 110 us.

We have invented a VCO calibration algorithm, which trims the VCO center frequency to the desired value. The circuit works with a 44 MHz clock. The total time required for the calibration is less than 110 us. Rdy2Cal is raised to indicate the finish of calibration. vcoErr is raised to indicate an error.

While the preferred embodiment of the invention has been described, it will be apparent to those skilled in the art that various modifications may be made in the embodiment without departing from the spirit of the present invention. Such modifications are all within the scope of this invention.

What is claimed is:

1. A frequency synthesizer to lock the frequency controlled oscillator (VCO) with a reference frequency, comprising:

a reference frequency;

a phase detector;

a low pass filter to filter out any ac component from said phase detector and to derive a dc control voltage; and a voltage controlled oscillator (VCO), whose frequency is divided by a divider to compare with said reference frequency and is controlled by said dc control voltage, which is applied in two sequential modes: a calibration mode and an analog mode, wherein said calibration mode locks coarsely said VCO into limited number of discrete frequency steps within a predetermined frequency tolerance of the reference frequency by resetting and holding said dc control voltage in a coarse phase-locked loop, and said analog mode starts with the said dc control voltage reset and held during the calibration mode for fine adjustment of said VCO frequency to lock with said reference frequency in a fine phase-locked loop.

2. The frequency synthesizer as described in claim 1, wherein:

said phase detector for the analog mode comprises a phase comparator and a charge pump, and said phase detector for said calibration mode comprises a stepper to reset said dc control voltage into a predetermined number of steps and is disabled to switched to said analog mode when the dc control voltage locks the VCO frequency within a preset tolerance of said reference frequency.

3. The frequency synthesizer as described in claim 2, wherein said stepper comprises a clock, a counter, and a decision-making block to incrementally step-change said dc control voltage.

4. The frequency synthesizer as described in claim 3, wherein the number of steps is a binary-weighted number.

5. The frequency synthesizer as described in claim 3, wherein said decision-making block is a control unit that selects between enabling and disabling the counter, calculates the value of the VCO dc control voltage, and selects between braking and reconnecting the PLL for the calibration mode.

6. The frequency synthesizer as described in claim 3, wherein said counter and said decision-making block are finite state machines.

* * * * *